(12) United States Patent
Jakobsson

(10) Patent No.: US 6,977,978 B1
(45) Date of Patent: Dec. 20, 2005

(54) ADAPTIVE CHANNEL FILTRATION FOR COMMUNICATIONS SYSTEMS

(75) Inventor: Peter Jakobsson, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 707 days.

(21) Appl. No.: 09/678,164

(22) Filed: Oct. 2, 2000

(51) Int. Cl.$^7$ ................................. H04B 1/10
(52) U.S. Cl. ....................................... 375/350
(58) Field of Search ................ 375/350, 232, 375/319; 708/300, 313, 322

(56) References Cited

U.S. PATENT DOCUMENTS

| | | | | |
|---|---|---|---|---|
| 5,512,898 A | * | 4/1996 | Norsworthy et al. | 341/155 |
| 5,953,380 A | * | 9/1999 | Ikeda | 375/346 |
| 6,141,372 A | * | 10/2000 | Chalmers | 375/147 |
| 6,370,205 B1 | * | 4/2002 | Lindoff et al. | 375/319 |
| 6,516,185 B1 | * | 2/2003 | MacNally | 455/234.1 |

FOREIGN PATENT DOCUMENTS

| | | | |
|---|---|---|---|
| GB | 2 328 353 A | 2/1999 | |
| WO | WO 99/35754 | 7/1999 | |
| WO | WO 9935754 A1 | * 7/1999 | ............ H04B 1/10 |

OTHER PUBLICATIONS

EPO Search Report, RS 105783 US; mailed Jun. 29, 2001.

\* cited by examiner

Primary Examiner—Mohammed Ghayour
Assistant Examiner—Pankaj Kumar

(57) ABSTRACT

Adaptive channel filtration enables a filter to be adaptively optimized for both co-channel and adjacent channel rejection performance (e.g., even as conditions change in a Rayleigh-fading environment). Principles of the present invention may be incorporated into a homodyne-based receiver architecture. In an exemplary homodyne-based receiver, the power of the adjacent channel interferer is calculated (e.g., determined, estimated, etc.), and an associated (e.g., low pass) channel filter is adapted depending on a ratio involving the total power (e.g., the desired channel plus the adjacent channel) and the adjacent channel power. In one or more embodiments, such a ratio is used with a look up table to produce a desired channel filter bandwidth, which may be used as a basis for creating coefficients for utilization by a low pass channel filter.

37 Claims, 7 Drawing Sheets

| $C/I_{Adj200kHz}$ [dB] | Filter Bw [kHz] |
|---|---|
| -12 | 78 |
| -9 | 82 |
| -6 | 93 |
| -3 | 100 |
| 0 | 107 |
| 3 | 117 |
| 6 | 123 |

FIG. 5

ADAPTIVE CHANNEL FILTRATION FOR COMMUNICATIONS SYSTEMS

BACKGROUND OF THE INVENTION

1. Technical Field of the Invention

The present invention relates in general to the field of communications systems, and in particular, by way of example but not limitation, to adaptive channel filtrations that are responsive to relative levels of received signal power in wireless communications systems.

2. Description of Related Art

Mobile wireless communication is becoming increasingly important to both individuals and organizations for providing safety, convenience, improved productivity, and simple conversational pleasure to subscribers of wireless communications services. One prominent mobile wireless communication option is cellular communication. Cellular phones, for instance, can be found in cars, briefcases, purses, and even pockets. While the number of cellular phone subscribers continues to rise, the types and quality of services being demanded by cellular phone subscribers are dramatically rising as well. One type of service whose popularity has been skyrocketing, especially with the emerging prominence of e-mail, faxing, and the Internet, is data transmission.

Data may be transmitted on, for example, existing voice, data, and/or control channels. However, many of the new features that subscribers are demanding require extraordinarily high data transfer rates that cannot be effectively provided by existing channels. New mechanisms for transmitting at extraordinarily high data rates are needed to meet the demand. In accordance with the Global System for Mobile Communications ++ (GSM++) standard, a new scheme termed "Enhanced Data rates for Global Evolution" (EDGE) is under development. EDGE is intended to increase the data transfer rate available to mobile users.

EDGE systems achieve a high data transfer rate by changing the coding and modulation. Consequently, EDGE systems need a higher Carrier-to-Interference (C/I) performance ratio to achieve the intended higher data transfer rates. However, normal GSM cell planning specifications are used when designing EDGE systems so as not to reduce the total number of subscribers that may be accommodated by a given system. Because GSM cell planning specifications are reused, the requirements relating to adjacent channel rejection ($C/I_{A1}$) are of the same magnitude as for an ordinary GSM system. As a result, EDGE channel filters should not only avoid disturbing the C/I-performance, but they should also be capable of meeting the ordinary GSM adjacent channel requirements.

Conventional approaches are directed to optimizing the channel filter for the best compromise between adjacent channel rejection ($C/I_{A1}$) and co-channel (C/I) performance. This compromise, by definition, is optimal for only a single situation, if any. Consequently, receivers using the conventional approach are sub-optimal in most situations inasmuch as they use a fixed, pre-set compromise between adjacent channel rejection and co-channel performance.

SUMMARY OF THE INVENTION

The deficiencies of conventional approaches are overcome by the method, system, and arrangement of the present invention. For example, as heretofore unrecognized, it would be beneficial if the channel filter could be adaptively optimized responsive to current channel conditions. In fact, it would be beneficial if the channel filter could be adaptively optimized responsive to current Rayleigh-fading conditions.

In accordance with principles of certain embodiment(s) of the present invention, the optimal channel filter design changes along with the Rayleigh-fading in Rayleigh-faded environments. Also, the channel filter can be advantageously changed on a burst basis so that optimal performance is achieved in Rayleigh-fading environments, instead of merely in a predicted average environment. Principles of the present invention may be incorporated into a homodyne-based receiver architecture. In an exemplary homodyne-based receiver, the power of the adjacent channel interferer is calculated (e.g., determined, estimated, etc.), and an associated channel filter is adapted depending on the ratio between the total power (e.g., the desired channel plus the adjacent channel) and the adjacent channel power.

In one or more embodiments, the ratio between the total power and the adjacent channel power is used with a look up table to produce a needed channel filter bandwidth. (The look up table may be derived, for example, from a graph of frequency versus power spectrum magnitude.) The channel filter bandwidth may be relied on to create coefficients for utilization by a low pass filter. The low pass filter therefore optimally and adaptively filters out the adjacent channel in favor of the desired signal.

The above-described and other features of the present invention are explained in detail hereinafter with reference to the illustrative examples shown in the accompanying drawings. Those skilled in the art will appreciate that the described embodiments are provided for purposes of illustration and understanding and that numerous equivalent embodiments are contemplated herein.

BRIEF DESCRIPTION OF THE DRAWINGS

A more complete understanding of the method, system, and arrangement of the present invention may be had by reference to the following detailed description when taken in conjunction with the accompanying drawings wherein:

FIG. 5 illustrates an exemplary table with an exemplary relationship between adjacent channel rejection and channel filter bandwidth;

DETAILED DESCRIPTION OF THE DRAWINGS

In the following description, for purposes of explanation and not limitation, specific details are set forth, such as particular circuits, logic modules (implemented in, for example, software, hardware, firmware, some combination thereof, etc.), techniques, etc. in order to provide a thorough understanding of the invention. However, it will be apparent to one of ordinary skill in the art that the present invention may be practiced in other embodiments that depart from these specific details. In other instances, detailed descriptions of well-known methods, devices, logical code (e.g., hardware, software, firmware, etc.), etc. are omitted so as not to obscure the description of the present invention with unnecessary detail.

A preferred embodiment of the present invention and its advantages are best understood by referring to FIGS. 1–6B of the drawings, like numerals being used for like and corresponding parts of the various drawings. Aspects of the GSM standard will be used to describe an embodiment of the present invention. However, it should be understood that the principles of the present invention are applicable to other wireless communication standards (or systems), especially those that can benefit from C/I and $C/I_{A1}$ performance compensation.

Figure 1:
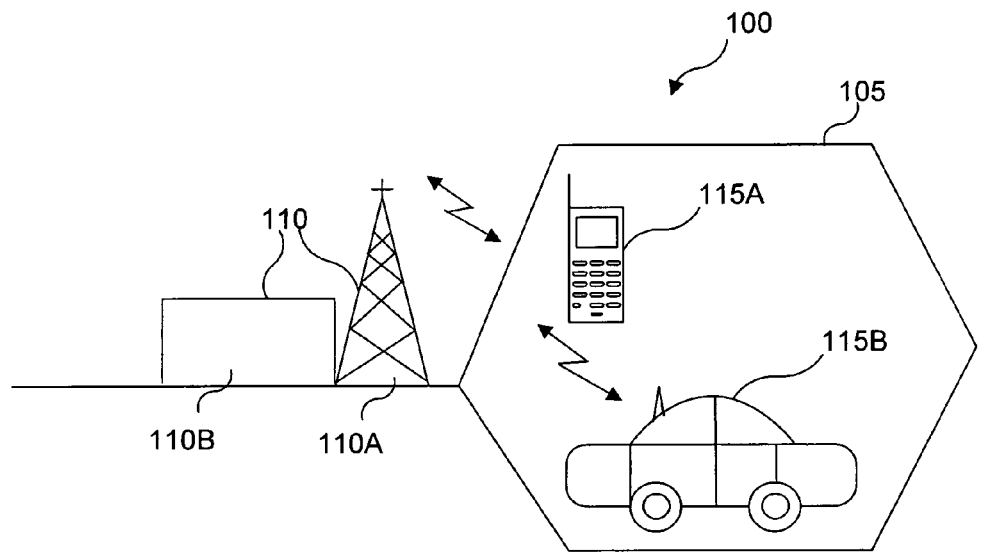
FIG. 1 illustrates an exemplary portion of an exemplary wireless network system with which the present invention may be advantageously practiced.

With reference to FIG. 1, an exemplary portion of an exemplary wireless network/communications system with which the present invention may be advantageously practiced and/or employed is illustrated generally at 100. The (portion of) wireless communications system 100 includes a cell 105 that is served by a base station (BS) 110. The BS 110 typically includes a base transceiver station (BTS) 110A and optionally includes a BS controller (BSC) 110B. Within the cell 105 are multiple mobile terminals (MTs) (e.g., mobile stations (MSs), etc.) 115A and 115B, each of which may be in communication with the wireless network infrastructure as represented by the BS 110. Each MT 115 may be, for example, a hand-held cellular phone (e.g., the MT 115A), a vehicle-mounted MT (e.g., the MT 115B), a data terminal with a wireless link (not specifically shown), etc. While only two MTs 115 are shown in the wireless communications system 100, many more MTs 115 are usually present within each such cell 105. Also, it should be noted that the wireless communications system 100 is usually composed of many such cells 105 and BSs 110.

Figure 2:
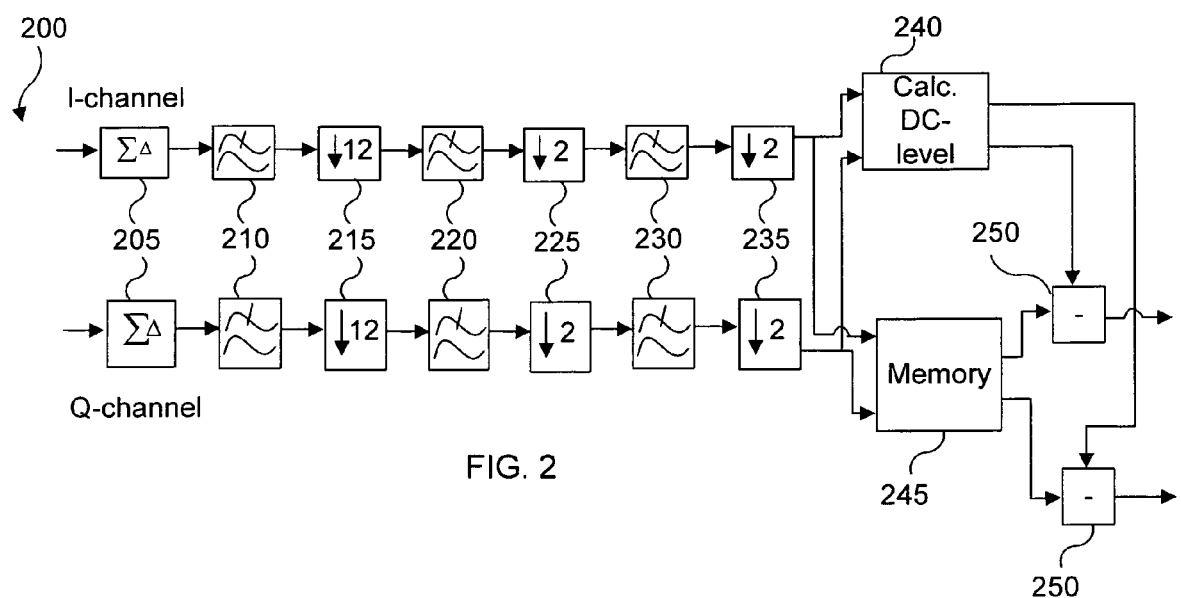
FIG. 2 illustrates an exemplary homodyne-based receiver architecture that may be implemented in the exemplary wireless network system of FIG. 1.

With reference to FIG. 2, a homodyne-based receiver architecture that may be implemented in the exemplary wireless network system of FIG. 1 is illustrated generally at 200. The receiver architecture 200 includes branches for both the in-phase (I)-channel and the quadrature-phase (Q)-channel. Sigma-delta analog-to-digital (A/D)-converters 205 may operate at an exemplary forty-eight (48) times over sampling. The sigma-delta A/D-converters 205 convert the received analog signal to a digital format for signal manipulation. The exemplary 48 times oversampling ratio is adequate to achieve a dynamic range that is required by the GSM standard without needing an Automatic Gain Control (AGC).

The receiver architecture 200 also includes three (e.g., digital) low pass (LP) filters 210,220,230 and three decimation blocks 215,225,235. The three LP filters 210,220,230 remove noise and received interfering signals from the desired signal. The LP-filtering also enables decimation of the received data without having the noise or received interfering signals folded into the spectrum of the desired signal. The LP filters 230 are the narrowest filters. They are used to filter out the desired channel and to block the first adjacent channel, and they are typically the most complex filters. The optimal bandwidth of these LP filters 230 are set based on the adjacent channel GSM requirements. The decimation blocks 215,225,235 reduce the data rate by the exemplary "12", "2", and "2" decimation factors, respectively.

Because the received signal is converted down to direct current (DC) in homodyne receivers, it is necessary for the received signal to be separated from the DC-offset produced by imperfections in the homodyne receiver. To meet this need, the DC-offset is subtracted from the received signal. The DC-level calculation block 240 calculates the average DC value during, e.g., a received burst. Meanwhile, the received signal is stored in a memory 245 (e.g., a first-in first-out (FIFO) memory) while the average DC value is being calculated by the DC-level calculation block 240. After the average DC-offset is calculated by the DC-level calculation block 240, the average DC value may be subtracted from the DC-level of the received signal at the subtraction blocks 250 for both of the I-channel and the Q-channel components to correct for the DC-offset. The DC-offset-corrected signals for both of the I-channel and the Q-channel components may thereafter be forwarded from the subtraction blocks 250.

Figure 3A:
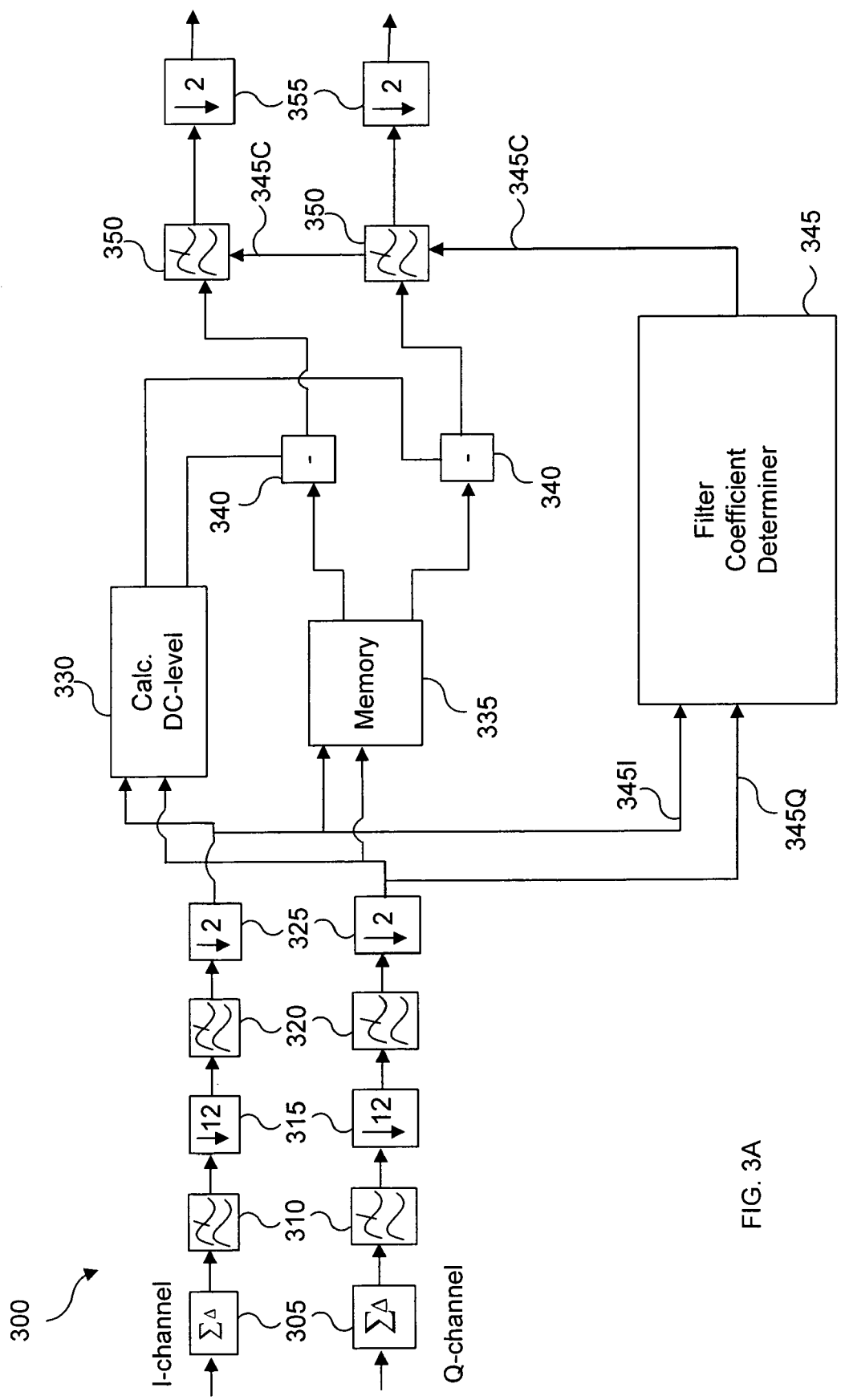
FIG. 3A illustrates an exemplary homodyne-based receiver architecture in accordance with the present invention that may be implemented in the exemplary wireless network system of FIG. 1.

With reference to FIG. 3A, an exemplary homodyne-based receiver architecture in accordance with the present invention that may be implemented in the exemplary wireless network system of FIG. 1 is illustrated generally at 300. The receiver architecture 300 includes branches for both the I-channel and the Q-channel. Sigma-delta A/D-converters 305 may operate at an exemplary forty-eight (48) times over sampling. The sigma-delta A/D-converters 305 convert the received analog signal to a digital format for enhanced signal manipulation. The exemplary 48 times oversampling ratio is adequate to achieve a dynamic range that is required by the GSM standard without needing an AGC; however, it should be noted that other oversampling values may be utilized without departing from the scope of the present invention.

The receiver architecture 300 also includes two initial (e.g., digital) LP filters 310,320 and two initial decimation blocks 315,325. The two LP filters 310,320 remove noise and received interfering signals from the desired signal. The LP-filtering also enables decimation of the received data without having the noise or received interfering signals folded into the spectrum of the desired signal. The decimation blocks 315,325 reduce the data rate by the exemplary decimation factors of "12" and "2", respectively. To remove the DC offset present in homodyne-based receivers, the DC-offset may be subtracted from the received signal. The DC-level calculation block 330 may calculate the average DC value during, e.g., a received burst. It should be noted that other time periods can alternatively be used. Additionally, the received signal may be stored in a memory 335 (e.g., a FIFO memory) while the average DC value is being calculated by the DC-level calculation block 330. After the average DC-offset is calculated by the DC-level calculation block 330, the average DC-offset value may be subtracted from the DC-level of the received signal at the subtraction blocks 340 for both of the I-channel and the Q-channel components to correct for the DC-offset.

In contrast with the receiver architecture 200, the receiver architecture 300 includes at least one variable (e.g., adjustable) LP filter 350 for filtering out the desired channel and for blocking the first adjacent channel. The optimal filter bandwidth of these LP filters 350 may be established by adjusting the controlling coefficients based on the relative signal strengths of the desired and adjacent channels. The filter coefficient determiner 345 may receive as input the I-channel and Q-channel component outputs from the decimators 325 on paths 345I and 345Q, respectively. The filter coefficient determiner 345, an embodiment of which is described in greater detail hereinbelow with reference to FIG. 3B, determines appropriate coefficients for establishing an optimal filtering bandwidth for LP filters 350. These coefficients, or other control signal(s) for defining the bandwidth of a filter, are provided to the LP filters 350 on path(s) 345C. After the LP filtering by the LP filters 350, decimation blocks 355 reduce the data rate by the exemplary decimation factor of "2". The resulting signals for both of the I-channel and the Q-channel components may be forwarded thereafter for further processing.

Figure 3B:
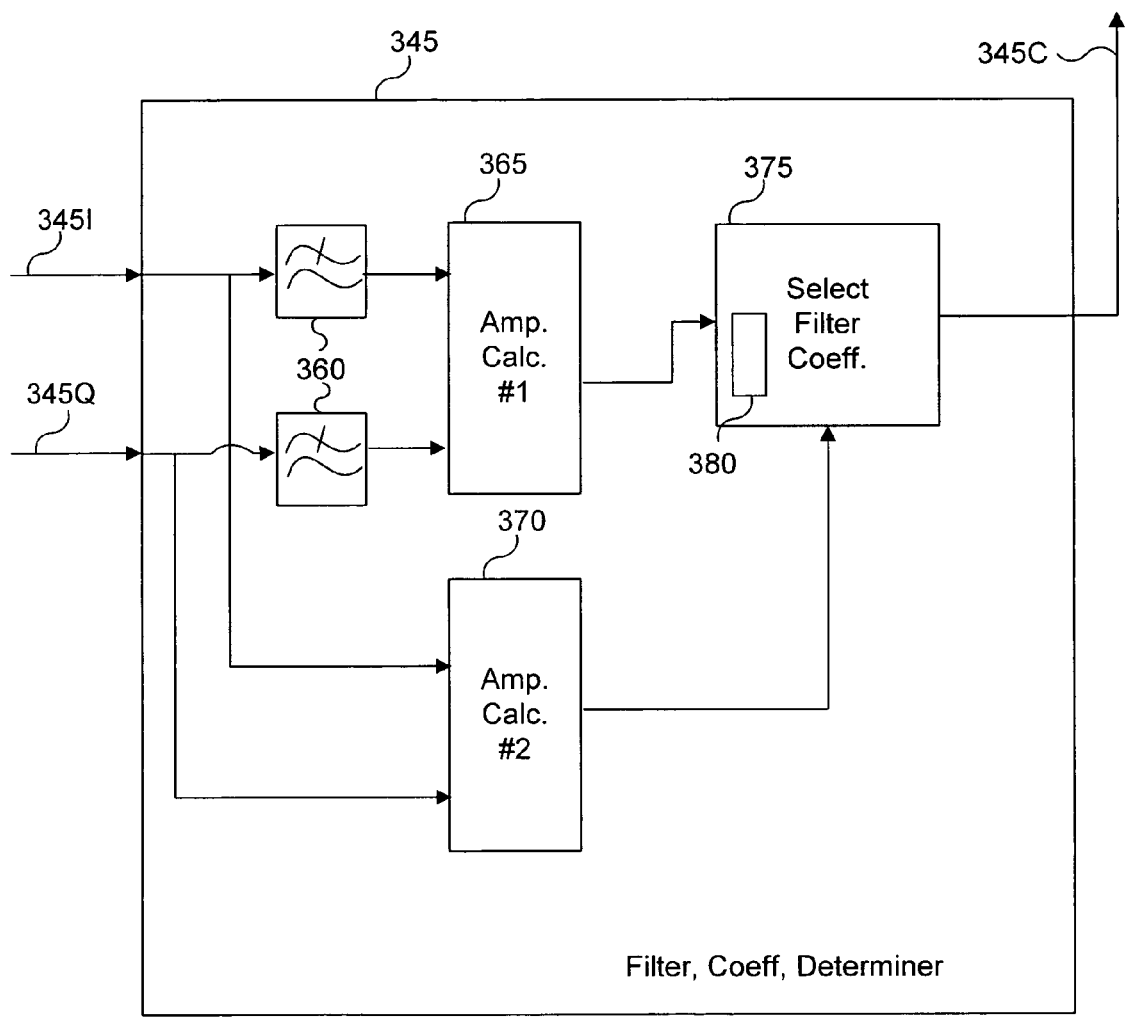
FIG. 3B illustrates a portion of the exemplary homodyne-based receiver architecture of FIG. 3A in accordance with the present invention that may be implemented in the exemplary wireless network system of FIG. 1.

With reference to FIG. 3B, a portion of the exemplary homodyne-based receiver architecture 300 of FIG. 3A in accordance with the present invention that may be implemented in the exemplary wireless network system of FIG. 1 is illustrated at 345. An I-channel and a Q-channel component are received as input at the filter coefficient determiner 345 on paths 345I and 345Q, respectively. An I-channel and a Q-channel component are fed to high pass (HP) filters 360. The resulting HP filtered signals are forwarded to an amplitude/power calculation #1 block 365, which determines the amplitude of the adjacent channel power (e.g., of the adjacent channel interferer). An I-channel and a Q-channel component are also fed to an amplitude/power calculation #2 block 370, which determines the amplitude of the total power. Coefficient determination may be made based on the relationship between the total power and the adjacent channel power. In an exemplary GSM embodiment, the calculation of such a relationship between the adjacent channel and the wanted signal is performed at two times the GSM rate (e.g., $F_s=2*13/48$ MHz).

The power calculations in the amplitude/power calculation #1 block 365 and the amplitude/power calculation #2 block 370 may be performed in a myriad of manners and with various numbers of samples, depending on the desired accuracy. An economical option is to "reuse" the hardware (not explicitly shown) that is used to calculate the power after the last channel filter (also not explicitly shown) of the exemplary homodyne-based receiver architecture 300 of FIG. 3B. In certain embodiments, the power calculations may be accomplished by estimating the amplitude with the following exemplary approximation: Amp=Max(I,Q)+0.5*Min(I,Q). It should be noted that other approximations or more exact techniques may be employed without departing from the scope of the invention. It should be understood that "calculate/calculation/etc.", as they are used in this disclosure, encompass and embrace, at least, calculate, determine, estimate, ascertain, approximate, etc. Each of the amplitude/power calculation #1 block 365 and the amplitude/power calculation #2 block 370 forward their respective amplitude calculations to select filter coefficient(s) block 375. The select filter coefficient(s) block 375 may use an average relationship between the amplitude calculation results of the amplitude/power calculation #1 block 365 and the amplitude/power calculation #2 block 370 to determine the filter coefficients for the LP channel filters 350 (of FIG. 3A). The filter coefficient(s) are passed from the select filter coefficient(s) block 375 to the LP channel filters 350 via path(s) 345C. In one embodiment, as is described in greater detail hereinbelow with reference to FIGS. 4 and 5, the filter coefficient(s) selection performed by the select filter coefficient(s) block 375 may be accomplished by linking different stored coefficients with/to different correspondence relationships between calculated amplitudes and filter bandwidths. It should be noted that the choice of the HP filter type may also impact performance, but such a choice should not be an overly critical aspect of performance.

The receiver architecture 300, using the filter coefficient determiner 345, enables the LP filters 350 to be adaptively optimized for both co-channel and adjacent channel rejection performance. It should be noted that in certain embodiments, a trade off exists between the adjacent channel suppression and the link performance (e.g., as measured by block error rate (BER) and raw bit error). Simulations have indicated that the position of the "BER-knee" (e.g., in graphs of C/I versus uncoded block error (UBLER)) changes with the simulated C/I. It should further be noted that the limiting factor on the C/I performance for the complete MT or BS therefore needs to be known before the filters are designed in order to prevent the channel filter from limiting the overall performance. Simulations have also indicated the existence of a trade off between adjacent channel suppression and the maximum C/I performance attainable without any significant degradation of the performance due to the filters. As a result, if/when the maximum C/I is set to a lower value by other parts of the, e.g., MT or BS, then it is possible to increase the adjacent channel rejection without any significant loss in the overall performance.

Continuing now with FIG. 3B, the amplitude/power calculation #1 block 365 calculates the power of the adjacent channel, and the amplitude/power calculation #2 block 370 calculates the power of the sum of the wanted signal and the adjacent channel. The ratio $P_{C/I}$ is determined therefrom as follows:

$$P_{C/I} = \frac{P_{Amp...calc...\#2...block} - P_{Amp...calc...\#1...block}}{P_{Amp...calc...\#1...block}} = \frac{C}{I_{Adj200 \text{ kHz}}}$$

It should be noted that the "200 kHz" is exemplary only, and other adjacent channel frequency values may be selected. Advantageously, if the signal values are converted into logarithmic amplitude (s) (e.g., by using existing hardware), such a calculation of a relationship involving the adjacent channel power and the total power transforms from a division to a simpler subtraction. In accordance with certain principles of the present invention, the ratio $P_{C/I}$ may be used to determine the optimal bandwidth of the adjacent channel filter as is described further with reference to FIGS. 4 and 5.

Figure 4:
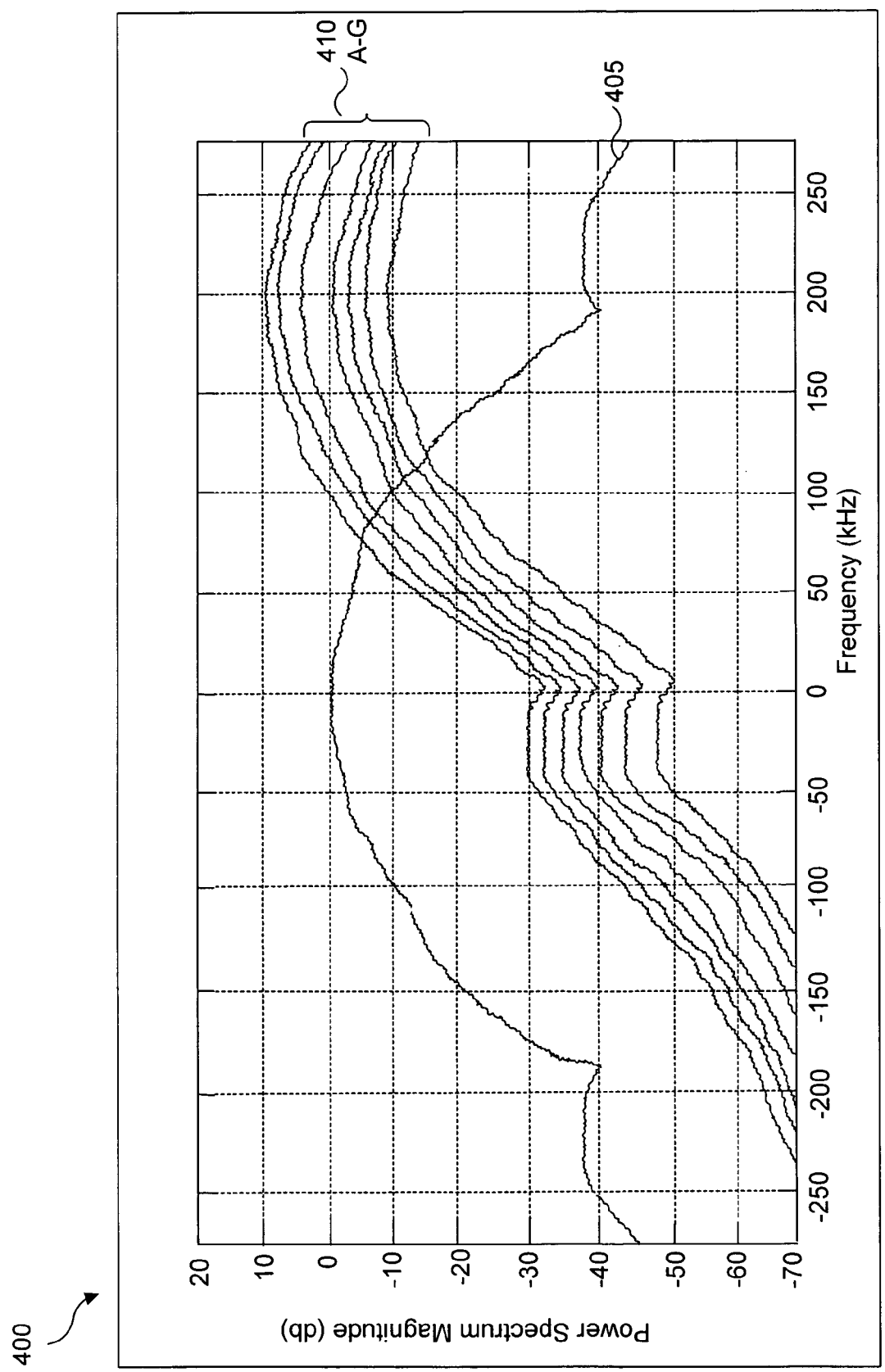
FIG. 4 illustrates an exemplary graph of frequency versus power spectrum magnitude.

With reference to FIG. 4, an exemplary graph of frequency versus power spectrum magnitude is illustrated generally at 400. In the graph 400 (which may be calculated using, for example, a commercial simulator such as Matlab), the wanted signal 405 is plotted together with multiple levels of interferer 410A–G so that the ratio PC/I may be used to determine the optimal bandwidth of the adjacent channel filter. The graph 400 covers the range $C/I_{Adj200kHz}=-12$ to +6 dB in steps of 3 dB. (It should be noted that the power levels in the graph 400 may appear to be 3 dB too low. However, the interference spectrum is only plotted in the (exemplary) graph 400 for positive frequencies, so there should be identical copies centered at −200 kHz. In other words, half of the energy in the interfering signal is located at positive frequencies and half of the energy is located at negative frequencies.)

The graph 400 may be used to create a correspondence relationship between wanted bandwidth and the ratio $C/I_{Adj200kHz}$. For example, a look up table of wanted bandwidth as a function of the ratio $C/I_{Adj200kHz}$ may be established. Such a correspondence (e.g., a look up table, data structure, etc.) may be stored in a memory 380 (of FIG. 3B), for example. Other techniques for storing or accessing the correspondence may alternatively be employed. In one embodiment, the bandwidth of the channel filter may be set by the point where the power of the interferer 410A–G equals the power of the wanted signal 405. With respect to interfering signal 410G, for example, the wanted signal 405 is equal to the interfering signal 410G at approximately −12 dB along the y-axis (ordinate). The corresponding frequency along the x-axis (abscissa) is approximately 122 kHz, which results in a needed filter bandwidth of 78 kHz for the LP filters 350.

With reference to FIG. 5, an exemplary table with an exemplary correspondence relationship between adjacent channel rejection and channel filter bandwidth is illustrated generally at 500. The table 500, or an equivalent data structure, may be stored in, for example, the memory 380 (of FIG. 3B). The table 500 provides a correspondence between the ratio $C/I_{Adj200kHz}$ in dB of column 505 and the filter bandwidth (BW) value in kHz of column 510. The first row, for instance, provides the above-explained correspondence between −12 dB in the column 505 of the interfering signal (410G) and the corresponding filter BW of 78 kHz in the column 510. A set of different filter coefficients for each bandwidth of a filter BW collection (such as that provided in the column 510) may be pre-calculated and stored in a memory, such as the memory 380, in manner(s) known to those of ordinary skill in the art. For example, given the bandwidth and the complexity of the intended filter, it is possible to calculate appropriate coefficients using, e.g., a commercial simulator. It should be noted that the memory may be different from the memory used to store the table 500 and that the memory 380 may be constituted of one or more of many different available memory types, such as read-only memory (ROM). The stored filter coefficients, once retrieved, may be forwarded along path(s) 345C (of FIG. 3B). In this manner, differing sets of filter coefficients can be employed depending on the calculated power ratio $C/I_{Adj200kHz}$, thereby adapting the filtering parameters to the current operating conditions.

Figure 6A:
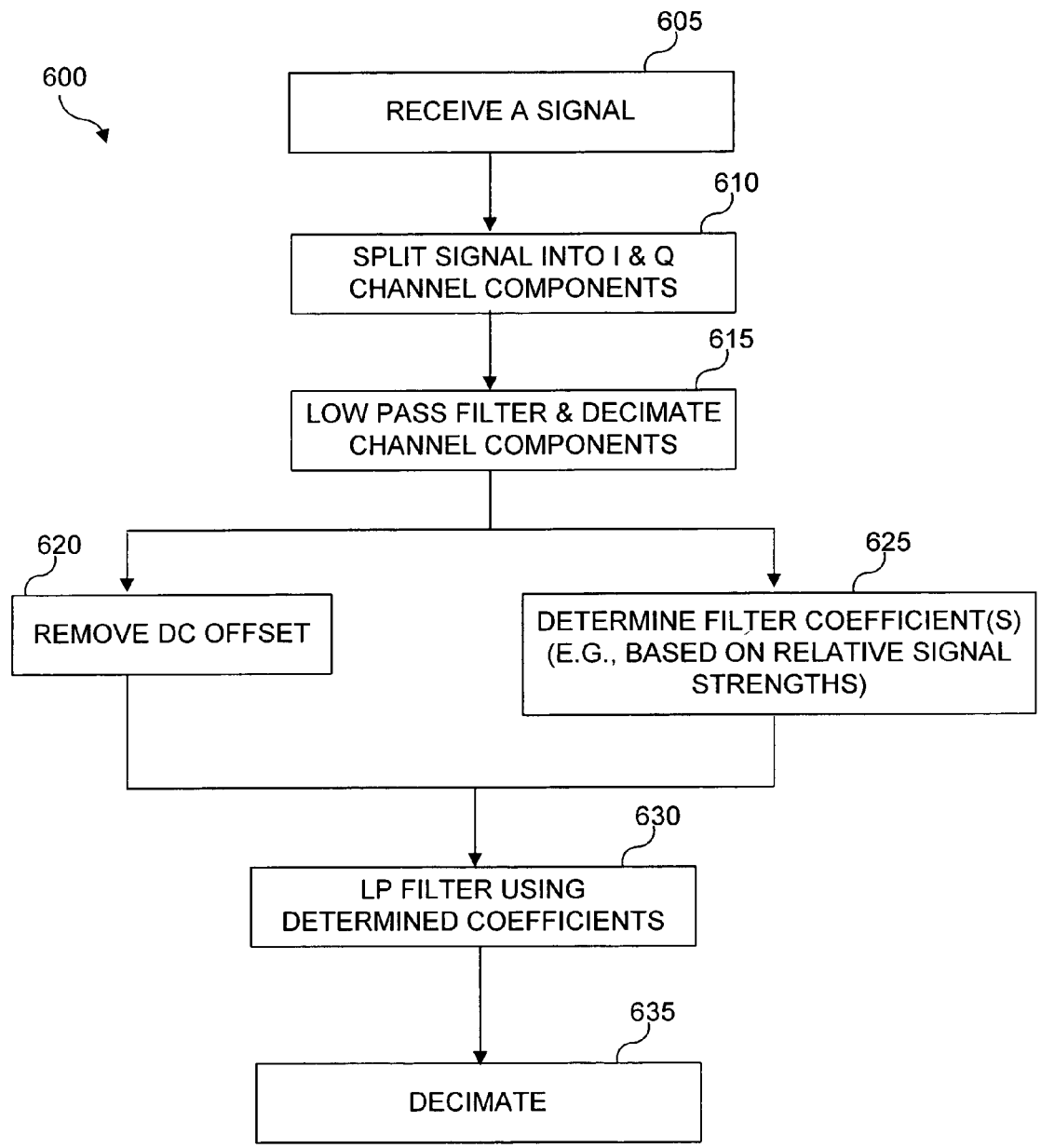
FIG. 6A illustrates an exemplary method in flowchart form for adaptively filtering a signal in accordance with the present invention.

With reference to FIG. 6A, an exemplary method in flowchart form for adaptively filtering a signal in accordance with the present invention is illustrated generally at 600. A signal is received at a receiver (e.g., a receiver of an MT or a BS) (step 605). The received signal is split into I-channel and Q-channel components (step 610). The split I-channel and Q-channel components are low pass filtered and decimated one or more times (step 615). The DC-offset (e.g., if the receiver is a homodyne receiver) is removed (step 620). Either before, during, and/or after (e.g., depending on relative durations and/or whether DC-offset removal is performed), filter coefficient (s) are determined (step 625). The filter coefficient(s) may be determined, for example, based on relative signal strengths of the received signal(s). The signal resulting from the DC-offset removal is low pass filtered using the determined coefficient(s) (step 630). The low-pass-filtered signal may then be decimated (step 635) before being forwarded for further processing.

Figure 6B:
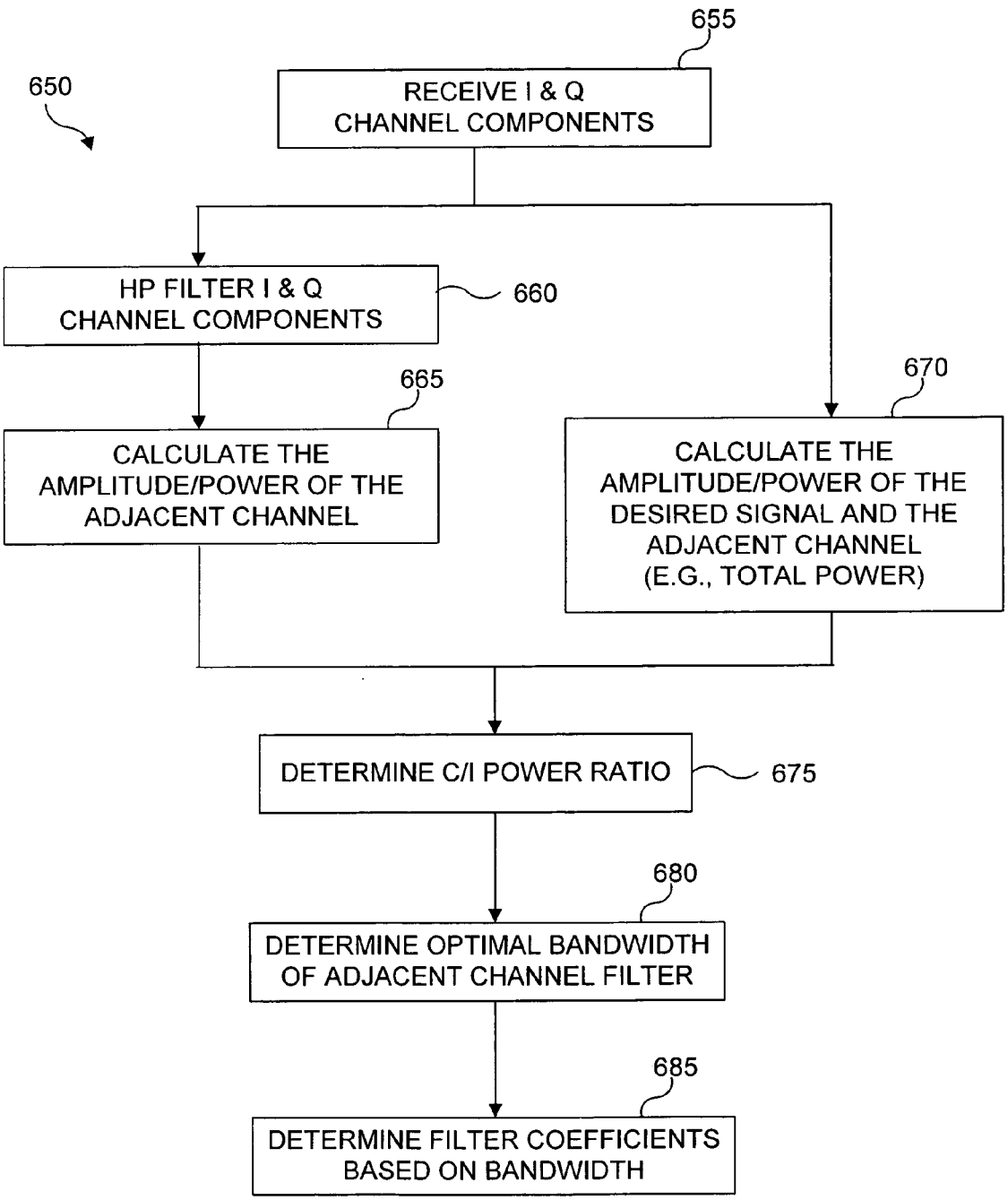
FIG. 6B illustrates another exemplary method in flowchart form for adaptively filtering a signal in accordance with the present invention.

With reference to FIG. 6B, another exemplary method in flowchart form for adaptively filtering a signal in accordance with the present invention is illustrated generally at 650. The flowchart 650 may be part of a larger scheme and correspond to, for example, the step 625 of the flowchart 600 of FIG. 6A. The flowchart 650 begins by receiving I-channel and Q-channel components (step 655). These I-channel and Q-channel components may optionally have already been low pass filtered and decimated (e.g., as performed in the step 615 of the flowchart 600 of FIG. 6A). The I-channel and Q-channel components each follow two paths. One set of the I-channel and Q-channel components are high pass filtered (e.g., to attempt to isolate the adjacent channel interferer(s)) (step 660). After high pass filtering, the amplitude/power of the adjacent channel may be calculated (step 665).

For another set of the I-channel and Q-channel components, the amplitude/power of the desired signal as well as the adjacent channel (e.g., the total power) may be calculated (step 670). The results of the two amplitude/power calculations (from steps 665 and 670) may be used to determine the C/I power ratio (step 675). From the C/I power ratio, the optimal bandwidth of an adjacent channel filter is determined (step 680). Filter coefficients for the adjacent channel filter may be determined based on the determined optimal bandwidth (step 685). The determined filter coefficients may be used by a low pass filter for filtering out an adjacent channel interferer (e.g., as performed by the step 630 in the flowchart 600 of the FIGURE 6A).

Although preferred embodiment(s) of the method and system of the present invention have been illustrated in the accompanying Drawings and described in the foregoing Detailed Description, it will be understood that the present invention is not limited to the embodiment(s) disclosed, but is capable of numerous rearrangements, modifications, and substitutions without departing from the spirit and scope of the present invention as set forth and defined by the following claims.

What is claimed is:

1. A method for adaptively filtering a signal, comprising the steps of:
   receiving a signal;
   processing the signal to produce a first processed signal, the first processed signal including a desired portion and an adjacent portion;
   removing a direct current (DC) offset of the first processed signal to produce a second processed signal;
   determining filter coefficients based on relative signal strengths of the desired portion and the adjacent portion; and
   low pass filtering the second processed signal utilizing the filter coefficients to produce a third processed signal;
   wherein said step of determining filter coefficients based on relative signal strengths of the desired portion and the adjacent portion comprises the steps of:
   high pass filtering the first processed signal to substantially extract the adjacent portion;
   calculating the power of the adjacent portion;
   calculating the power of the first processed signal;
   determining a power ratio responsive to the power of the adjacent portion and the power of the first processed signal;
   determining a bandwidth for an adjacent channel filter based on the power ratio; and
   determining filter coefficients for the adjacent channel filter responsive to the bandwidth of the adjacent channel filter.

2. The method according to claim 1, wherein said step of processing the signal to produce a first processed signal comprises the steps of:
   splitting the signal into an in-phase (I) channel component and a quadrature-phase (Q) channel component;
   low pass filtering each of the I channel component and the Q channel component; and
   decimating each of the I channel component and the Q channel component.

3. The method according to claim 1, wherein said step of removing a direct current (DC) offset of the first processed signal to produce a second processed signal comprises the steps of:
  storing the first processed signal to produce a stored first processed signal;
  determining a DC level value of the first processed signal; and
  subtracting the DC level value from the stored first processed signal to produce the second processed signal.

4. The method according to claim 1, further comprising the steps of:
  decimating the third processed signal to produce a fourth processed signal; and
  forwarding the fourth processed signal for further processing.

5. The method according to claim 1, wherein said step of determining is performed at least once per burst in a time division multiple access (TDMA) scheme.

6. The method according to claim 1, wherein said step of low pass filtering the second processed signal comprises the steps of:
  ascertaining said set of filter coefficients that provide a filtering bandwidth substantially equivalent to a bandwidth of an adjacent channel filter based on a power ratio.

7. The method according to claim 1, further comprising the steps of:
  receiving said second processed signal; and
  decimating said second processed signal to reduce digital samples to produce said third processed signal.

8. A method for adaptively filtering a signal, comprising the steps of:
  receiving a signal, the signal including a desired portion and an adjacent portion;
  high pass filtering the signal to produce an adjacent channel signal;
  calculating the power of the adjacent channel signal;
  calculating the power of the signal;
  determining a power ratio responsive to the power of the adjacent channel signal and the power of the signal;
  determining a bandwidth for a channel filter based on the power ratio; and
  low pass filtering the signal or a derivative of the signal using the channel filter configured responsive to the bandwidth.

9. The method according to claim 8, wherein said steps of calculating the power of the adjacent channel signal and calculating the power of the signal are accomplished by estimating an amplitude of the adjacent channel signal and the signal, respectively, according to the following formula:

$$Amp = Max(I,Q) + 0.5*Min(I,Q),$$

where "I" represents an in-phase (I) component and "Q" represents a quadrature-phase (Q) component for each amplitude for each of the adjacent channel signal and the signal, respectively.

10. The method according to claim 8, wherein said step of determining a power ratio responsive to the power of the adjacent channel signal and the power of the signal is accomplished according to the following formula:

$$\text{power ratio} = \frac{\text{power of the signal} - \text{power of the adjacent channel signal}}{\text{power of the adjacent channel signal}}$$

11. The method according to claim 8, wherein said step of determining a bandwidth for a channel filter based on the power ratio comprises the steps of:
  comparing the power ratio to a list of power ratios;
  selecting a selected power ratio from the list of power ratios that is closest to the power ratio; and
  determining the bandwidth that corresponds to the selected power ratio in the list of power ratios.

12. The method according to claim 8, wherein said step of low pass filtering the signal or a derivative of the signal using the channel filter configured responsive to the bandwidth comprises the steps of:
  ascertaining a set of filter coefficients that provide a filtering bandwidth substantially equivalent to the bandwidth; and
  applying the set of filter coefficients to a low pass filter.

13. The method according to claim 8, wherein the method is performed at least once per burst in a time division multiple access (TDMA) scheme.

14. An apparatus for adaptively filtering a signal, comprising:
  at least one analog-to-digital (A/D) converter, said at least one A/D converter receiving an analog signal and outputting a digital signal, the digital signal including a desired portion and an adjacent portion;
  a direct current (DC) offset part, said DC offset part adapted for receiving the digital signal or a derivative thereof and compensating for a DC offset to produce a compensated signal;
  a filter coefficient determiner, said filter coefficient determiner adapted for receiving the digital signal or the derivative thereof and producing as output a filter control signal based on relative signal strengths of the desired portion and the adjacent portion;
  at least one filter, said at least one filter receiving the filter control signal and being controlled thereby, said at least one filter adapted for filtering the compensated signal and producing a filtered output signal responsive to the filter control signal; and
  at least one decimator, said at least one decimator adapted for receiving the filtered output signal and decimating the filtered output signal to reduce the number of digital samples and produce a desired signal that is forwarded for further processing.

15. The apparatus according to claim 14, further comprising:
  at least one low pass filter, said at least one low pass filter receiving the digital signal and filtering the digital signal to filter out higher frequencies and to produce a first derivative digital signal; and
  at least one decimator, said at least one decimator receiving the first derivative digital signal and decimating the first derivative digital signal to reduce the number of digital samples and produce a second derivative digital signal.

16. The apparatus according to claim 15, wherein the second derivative digital signal comprises the derivative of the digital signal that is received by said DC offset part and said filter coefficient determiner.

17. The apparatus according to claim 15, wherein the second derivative digital signal is further low-pass filtered and decimated before comprising the derivative of the digital signal that is received by said DC offset part and said filter coefficient determiner.

18. The apparatus according to claim 14, wherein said DC offset part comprises:
  a DC-level determiner, the DC-level determiner adapted for receiving the digital signal or the derivative thereof as input and for producing as output a DC-level value associated with the digital signal or the derivative thereof, respectively;

a memory, the memory adapted for receiving and storing the digital signal or the derivative thereof; and at least one subtractor, the at least one subtractor adapted for determining the difference between the digital signal or the derivative thereof and the DC-level value.

19. The apparatus according to claim 14, wherein said filter coefficient determiner comprises:

at least one high pass filter, said at least one high pass filter adapted for receiving the digital signal or the derivative thereof and high pass filtering the signal to produce an adjacent channel signal;

a first power calculator, said first power calculator adapted for receiving the adjacent channel signal and calculating the power of the adjacent channel signal;

a second power calculator, said second power calculator adapted for receiving the digital signal or the derivative thereof and calculating the power of the signal; and a filter coefficient selector, said filter coefficient selector determining a power ratio responsive to the power of the adjacent channel signal and the power of the signal, said filter coefficient selector adapted for determining a bandwidth for a channel filter based on the power ratio and for ascertaining a plurality of filter coefficients based on the bandwidth, the filter control signal comprising the plurality of filter coefficients.

20. The apparatus according to claim 14, wherein the apparatus comprises a homodyne-based receiver.

21. The apparatus according to claim 14, wherein the apparatus comprises a mobile terminal operating substantially in accordance with the Global System for Mobile Communications ++ (GSM++) standard.

22. The apparatus according to claim 14, wherein the apparatus comprises a base station operating substantially in accordance with the Global System for Mobile Communications ++ (GSM++) standard.

23. The apparatus according to claim 14, wherein the filter control signal comprises a plurality of filter coefficients.

24. The apparatus according to claim 14, wherein said at least one A/D converter, said DC offset part, said filter coefficient determiner, and said at least one filter are comprised, at least partially, of software.

25. An arrangement for adaptively filtering a signal, comprising:

at least one high pass filter, said at least one high pass filter adapted for receiving a signal and high pass filtering the signal to produce an adjacent channel signal, the signal including a desired portion and an adjacent portion;

a first power calculator, said first power calculator adapted for receiving the adjacent channel signal and calculating the power of the adjacent channel signal;

a second power calculator, said second power calculator adapted for receiving the signal and calculating the power of the signal; and a filter coefficient selector, said filter coefficient selector determining a power ratio responsive to the power of the adjacent channel signal and the power of the signal, said filter coefficient selector adapted for determining a bandwidth for a channel filter based on the power ratio and for ascertaining a plurality of filter coefficients based on the bandwidth.

26. The arrangement according to claim 25, wherein said first power calculator and said second power calculator perform their respective calculations by estimating the amplitude of the adjacent channel signal and the signal, respectively, according to the following formula:

Amp=Max(I,Q)+0.5*Min(I,Q), where "I" represents an in-phase (I) component and "Q" represents a quadrature-phase (Q) component for each amplitude for each of the adjacent channel signal and the signal, respectively.

27. The arrangement according to claim 25, wherein said filter coefficient selector determines a power ratio responsive to the following formula:

$$\text{power ratio} = \frac{\text{power of the signal} - \text{power of the adjacent channel signal}}{\text{power of the adjacent channel signal}}$$

28. The arrangement according to claim 25, further comprising:

a memory, said memory storing a plurality of power ratio values in a look up table, each power ratio value of said plurality of power ratio values associated in said memory with a corresponding bandwidth; and wherein said filter coefficient selector is further adapted for accessing said memory to determine a selected power ratio that is closest to the power ratio and for retrieving the corresponding bandwidth that is associated with the selected power ratio.

29. The arrangement according to claim 25, further comprising:

a memory, said memory storing a plurality bandwidths, each bandwidth of said plurality of bandwidths associated in said memory with a corresponding set of filter coefficients; and wherein said filter coefficient selector is further adapted for accessing said memory to determine a selected bandwidth that is closest to the bandwidth and for retrieving the corresponding set of filter coefficients that is associated with the selected bandwidth.

30. The arrangement according to claim 25, further comprising:

an adjacent channel filter, said adjacent channel filter adapted for filtering responsive to received filter coefficients; and wherein said filter coefficient selector is further adapted for providing said plurality of filter coefficients to said adjacent channel filter.

31. The arrangement according to claim 25, wherein the arrangement comprises at least part of a homodyne-based receiver.

32. The arrangement according to claim 25, wherein said at least one high pass filter, said first power calculator, said second power calculator, and said filter coefficient selector are comprised, at least partially, of software.

33. The arrangement according to claim 25, wherein the arrangement comprises at least part of a mobile terminal.

34. The arrangement according to claim 25, wherein the arrangement comprises at least part of a base station.

35. An arrangement for adaptively filtering a signal, comprising:

means for receiving a signal, the signal including a desired portion and an adjacent portion;

means for filtering the signal to produce an adjacent channel signal;

means for calculating the power of the adjacent channel signal and for calculating the power of the signal;

means for determining a power ratio responsive to the power of the adjacent channel signal and the power of the signal;

means for determining a bandwidth for a channel filter based on the determined power ratio;

means for configuring the channel filter responsive to the determined bandwidth; and means for channel filtering the signal or a derivative of the signal using the configured channel filter.

36. The receiver of claim 35, further comprising:

means for ascertaining said set of filter coefficients that provide a filtering bandwidth substantially equivalent to a bandwidth of an adjacent channel filter based on a power ratio.

37. The receiver of claim 35, further comprising:

means for receiving said second processed signal; and means for decimating said second processed signal to reduce digital samples to produce said third processed signal.

* * * * *

UNITED STATES PATENT AND TRADEMARK OFFICE
CERTIFICATE OF CORRECTION

PATENT NO.       : 6,977,978 B1
APPLICATION NO.  : 09/678164
DATED            : December 20, 2005
INVENTOR(S)      : Jakobsson It is certified that error appears in the above-identified patent and that said Letters Patent is hereby corrected as shown below:

In Column 5, Line 4, delete "3451" and insert -- 345I --, therefor.

In Column 5, Line 22, delete "3451" and insert -- 345I --, therefor.

In Column 6, Line 53, delete "PC/I" and insert -- $P_{C/I}$ --, therefor.

Signed and Sealed this

Thirteenth Day of May, 2008

JON W. DUDAS
*Director of the United States Patent and Trademark Office*